United States Patent [19]

Bodtmann et al.

[11] 4,028,641
[45] June 7, 1977

[54] LINEAR PHASE MODULATOR INCLUDING A PAIR OF ARMSTRONG MODULATORS

[75] Inventors: William Fred Bodtmann, Middletown; Clyde Leslie Ruthroff, Holmdel, both of N.J.

[73] Assignee: Bell Telephone Laboratories, Incorporated, Murray Hill, N.J.

[22] Filed: May 11, 1976

[21] Appl. No.: 685,407

[52] U.S. Cl. .................................. 332/18; 332/23 R
[51] Int. Cl.² ......................................... H03C 3/40
[58] Field of Search .......... 332/18, 22, 23 R, 23 A, 332/24; 325/45, 145, 147

[56] References Cited

UNITED STATES PATENTS

| | | | |
|---|---|---|---|
| 2,238,249 | 4/1941 | Crosby | 332/23 R X |
| 2,431,569 | 11/1947 | Labin | 332/23 R X |
| 2,501,355 | 3/1950 | Pratt | 332/18 |
| 2,543,222 | 2/1951 | Bird | 332/23 R |
| 2,822,523 | 2/1958 | Bargellini | 332/22 X |
| 2,877,422 | 3/1959 | Holloway | 332/22 |
| 3,249,897 | 5/1966 | Trilling | 332/18 |
| 3,783,413 | 1/1974 | Froment et al. | 332/23 R |
| 3,818,378 | 6/1974 | Phillips | 332/23 A |
| 3,906,401 | 9/1975 | Seidel | 332/18 |

OTHER PUBLICATIONS

Ruthroff et al., "A Linear Phase Modulator for Large Baseband Bandwidths", The Bell System Technical Journal, Oct. 1970, pp. 1893-1903.

*Primary Examiner*—Siegfried H. Grimm
*Attorney, Agent, or Firm*—Erwin W. Pfeifle

[57] ABSTRACT

The present invention relates to a linear phase modulator comprising two known Armstrong modulators connected in a balanced configuration to eliminate even-order nonlinearities in the output phase modulated signal. In addition, a preselected amount of in-phase carrier is added to the quadrature carrier normally added to the output of the suppressed-carrier modulator forming a part of each Armstrong modulator, the carriers being added to each modulator output, however, differing in phase from quadrature by equal and opposite amounts. By properly preselecting the amount of phase difference from quadrature of the added carriers, third-order nonlinearities can also be substantially eliminated after combining the outputs of the Armstrong modulators in a multiplier circuit.

6 Claims, 4 Drawing Figures

LINEAR PHASE MODULATOR INCLUDING A PAIR OF ARMSTRONG MODULATORS

BACKGROUND OF THE INVENTION

1. Field of the Invention

The present invention relates to a linear phase modulator and, more particularly, to a linear phase modulator which has a stable carrier frequency, broad baseband capability, and substantially eliminates both even-order and third-order nonlinearities.

2. Description of the Prior Art

A desirable component in radio systems, where, for instance, phase-shift keying is used, is a linear phase modulator which has a stable carrier frequency and broad baseband capability. Linearity is particularly important in multilevel phase modulated systems to enable recovery of transmitted information at the receiving terminal without error.

A linear phase modulator with a stable carrier frequency is described in the article "A Linear Phase Modulator for Large Baseband Bandwidths" by C. L. Ruthroff and W. F. Bodtmann, *Bell System Technical Journal*, (BSTJ), Vol. 49, No. 8, October 1970, pp. 1893–1903 which is believed to be the closest prior art reference. There, an Armstrong modulator is described wherein the baseband signal is modulated in a double-sideband suppressed-carrier amplitude modulator. At the output of the modulator another carrier, 90° out-of-phase with the first carrier, is added to the sidebands. The residual amplitude-modulation is then removed by a limiter whose output is a low-index phase modulated signal. When the nonlinear distortion is small in the Armstrong modulator, the controlling distortions will be the second and third order terms. With proper adjustment of the out-of-phase carrier it is possible to substantially eliminate the second order terms. The article further discloses a modified arrangement having two Armstrong modulators connected in a balanced configuration which allows for double the phase deviation and the addition of either the same carrier frequency used for modulation or some other carrier.

BRIEF SUMMARY OF THE INVENTION

The present invention relates to a linear phase modulator and, more particularly, to a linear phase modulator which has a stable carrier frequency, broad baseband capability, and substantially eliminates both even-order and third-order nonlinearities.

The present invention further relates to a linear phase modulator comprising a pair of Armstrong modulators in a balanced configuration for eliminating even order nonlinearities wherein carriers are added which differ in phase from quadrature from the modulating carrier signal by equal and opposite amounts. By properly adjusting the amount of phase difference from quadrature in the added carriers, the third-order nonlinearity can also be substantially eliminated by combining the outputs of the Armstrong modulators in a multiplier circuit.

Other and further aspects of the present invention will become apparent during the course of the following description and by reference to the accompanying drawings.

BRIEF DESCRIPTION OF THE DRAWINGS

Referring now to the drawings.

DETAILED DESCRIPTION

Figure 1:
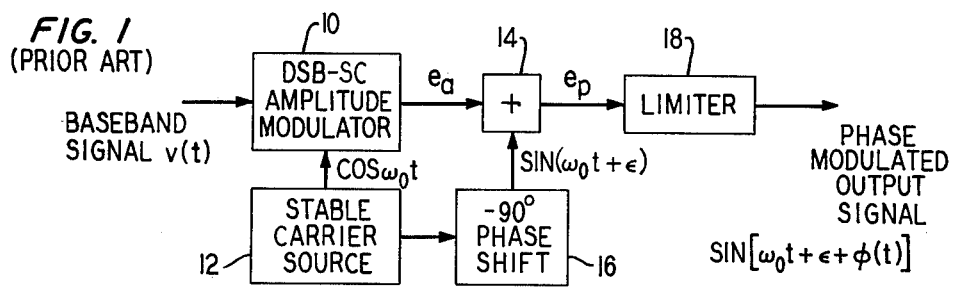
FIG. 1 is a simplified block diagram of a prior art Armstrong modulator.

One of the earliest methods of generating phase modulation consisted of adding a quadrature carrier to the output of a double-sideband suppressed-carrier modulator and then limiting the sum to remove amplitude variations. The apparatus for practicing this method is commonly known as the Armstrong modulator and is shown in FIG. 1. The concept of the Armstrong modulator was described in the hereinbefore cited BSTJ article by the present co-inventors, which description will be repeated here for a better understanding of the present linear phase modulator.

In the Armstrong modulator shown in FIG. 1, the baseband signal is modulated in a double-sideband suppressed-carrier amplitude modulator 10, with the carrier frequency from a stable carrier source 12, the modulator 10 having a sufficiently low index of modulation to ensure suitable linearity. At the modulator 10 output, a second carrier, 90° out-of-phase with the first, is added to the generated sidebands in an adder circuit 14. The second carrier can, of course, be generated by passing the original carrier frequency through a 90° phase shift circuit 16. The residual amplitude-modulation is removed by a limiter 18 whose output is a low-index phase-modulated signal. The phase distortion can be made arbitrarily small by choice of the carrier to sideband power ratio at the limiter input; the result is a nearly linear, low-index phase-modulated signal.

For example, when the baseband signal is $$e = v(t), \text{ with } |v(t)| \leq 1, \tag{1}$$

the output of the double-sideband suppressed-carrier amplitude modulator 10 is $$e_a = mv(t) \cos \omega_o t \tag{2}$$

where $m \leq 1$ is the index of modulation.

A quadrature carrier ($\sin \omega_o t + \epsilon$) is added to $e_a$ in approximately the correct phase in adder 14 to obtain $$e_v = \sin(\omega_o t + \epsilon) + mv(t) \cos \omega_o t. \tag{3}$$

Furthermore, $$e_v = \sqrt{1 + 2mv(t) \sin \epsilon + m^2 v^2(t)}$$

$$\cdot \sin \left[ \omega_o t + \epsilon + \tan^{-1} \frac{mv(t) \cos \epsilon}{1 + mv(t) \sin \epsilon} \right], \tag{4}$$

where $\epsilon$ is small and represents any error in the reinserted carrier.

If this signal is passed through a perfect limiter 18 the envelope becomes constant, leaving an angle modulated signal whose phase modulation is $$\phi(t) = \tan^{-1} \frac{mv(t) \cos \epsilon}{1 + mv(t) \sin \epsilon}. \tag{5}$$

When the nonlinear distortion is small, the controlling distortions will be second and third order so terms in the expansion of equation (5) beyond the third-order term will be omitted and (5) becomes $$\phi(t) \approx mv(t) \cos \epsilon - m^2 v(t)^2 \sin \epsilon \cos \epsilon + m^3 v(t)^3 \sin^2 \epsilon \cos \epsilon - (m^3/3) v(t)^3 \cos^3 \epsilon. \tag{6}$$

Ideally, $\epsilon = 0$ and the first term in equation (6) is the desired modulating signal; the second and third terms will be zero and the last term is the third-order distortion. When $\epsilon \neq 0$, second-order distortion occurs and the desired output signal amplitude is reduced by the factor $\cos \epsilon$.

It can be seen from equation (6) that the distortion can be made as small as desired by the proper choice of m, which is proportional to the phase deviation. Of course, in order to determine suitable values of m, the baseband signal, $v(t)$, must be specified.

Figure 2:
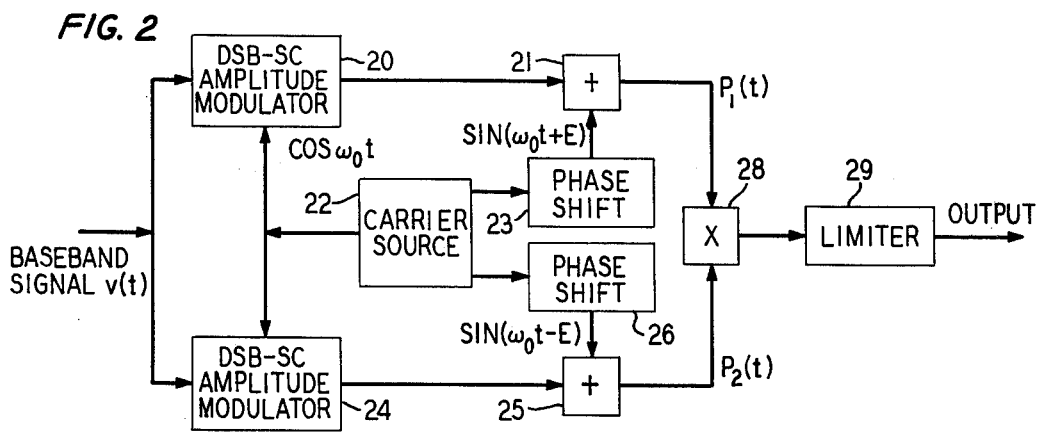
FIG. 2 is a simplified block diagram of a phase modulator according to the present invention.

FIG. 2 shows the preferred arrangement of the linear phase modulator in accordance with the present invention. Broadly, two Armstrong modulators are connected in a balanced configuration to substantially eliminate even-order nonlinearities. Additionally, some in-phase carrier is added to the quadrature carrier being added to the output of the double-sideband suppressed-carrier modulators. When the amount of in-phase carrier is properly adjusted the third-order nonlinearity is also substantially eliminated in the combined output signal from a multiplier circuit in the present linear modulator.

More particularly, a first Armstrong modulator comprising a double-sideband suppressed-carrier modulator 20, an adder circuit 21, a common carrier source 22 and a phase shift circuit 23, is connected in a balanced configuration with a second Armstrong modulator comprising a double-sideband suppressed-carrier modulator 24, an adder circuit 25, the common carrier source 22 and a phase shift circuit 26. The baseband signal shown in equation (1) is concurrently applied to one input of each of modulators 20 and 24. In modulators 20 and 24, the baseband signal modulates with the carrier frequency ($\cos \omega_o t$) from common carrier source 22 to generate an output signal at each modulator corresponding to the waveform indicated in equation (2).

The outputs from the two suppressed-carrier amplitude modulators 20 and 24 have carriers added in adder circuits 21 and 25, respectively, which differ in phase from quadrature by equal and opposite amounts. The carriers being added in adder circuits 21 and 25 are obtained by transmitting the output from the common carrier source 22 through adjustable phase shift circuits 23 and 26, respectively. The added carriers can, of course, also be alternatively generated by any suitable means. As shown in FIG. 2, the output signal from adjustable phase shift circuit 23 can be designated as $\sin (\omega_o t + E)$ and the output signal from adjustable phase shift circuit 26 can be designated as $\sin(\omega_o t - E)$, where E represents the amount by which the added carrier differs in phase from quadrature. The output from adder circuit 21 is $$\begin{aligned} P_1(t) &= mv(t) \cos \omega_o t + \sin(\omega_o t + E), |mv(t)| \leq 1. \\ &= \sqrt{1 + 2mv(t)\sin E + mv(t)^2} \sin[\omega_o t + \tan^{-1}(mv(t) + \sin E)/\cos E], \end{aligned} \tag{7}$$

while the output from adder circuit 25 is $$\begin{aligned} P_2(t) &= mv(t)\cos \omega_o t + \sin(\omega_o t - E) = \\ &\sqrt{1 - 2mv(t)\sin E + mv(t)^2} \sin[\omega_o t + \tan^{-1}(mv(t) - \sin E)/\cos E] \end{aligned} \tag{8}$$

where $mv(t)$ is the modulating signal.

The outputs from adder circuits 21 and 25 are concurrently combined in a multiplier circuit 28. The output phase modulation signal from multiplier circuit 28 is, therefore, the sum of the phase modulation signals $P_1(t)$ and $P_2(t)$ and can be written, similar to equation (5) for the single Armstrong modulator, as $$\phi(t) = \tan^{-1} \frac{2mv(t) \cos E}{1 - mv(t)^2}, -1 \leq mv(t) \leq 1. \tag{9}$$

The modulator characteristic can be described by eliminating the explicit time dependence of $\phi(t)$. Thus, (9) becomes $$\phi(m;E) = \tan^{-1} \frac{2m \cos E}{1 - m^2}, -1 \leq m \leq 1. \tag{10}$$

In this form, m is the input voltage (or current) and $\phi(m;E)$ is the output phase of the modulator. The parameter E can be chosen to optimize the modulator for any particular application.

For some applications it is useful to expand the modulation characteristic in a Taylor series. The first few terms are $$\begin{aligned} \phi(m;E) = 2\cos \epsilon(1 + m^3[1 - 4 \cos^2\epsilon/3] + m^5[1 - 4 \cos^2\epsilon + 16 \cos^4\epsilon/5] + m^7[1 - 8 \cos^2\epsilon + 16 \cos^4\epsilon - 64 \cos^6\epsilon/7] + ...) \end{aligned} \tag{11}$$

From equation (11) it can be seen that the output signal from the two Armstrong modulators in a balanced configuration does not include even-order nonlinearities. The output from multiplier 28 is preferably transmitted through a limiter 29 to remove any amplitude variations on the phase modulated output signal.

It may be noted from equation (10) that $\phi(0;E) = 0$ and $\phi(\pm 1;E) = \pm \pi/2$ independently of E. An ideal modulator with these endpoints has the equation $$\phi_L(m) = m\pi/2, -1 \leq m \leq 1. \tag{12}$$

Figure 3:
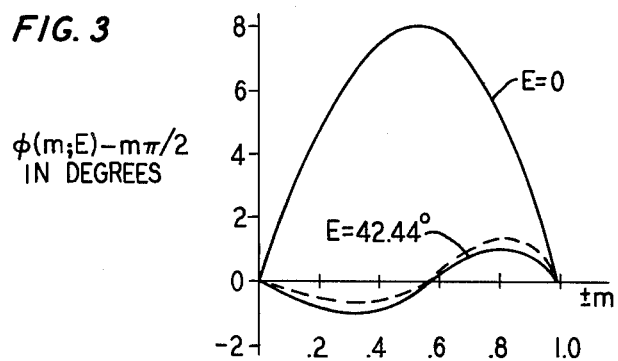
FIG. 3 is a curve indicating the difference in deviation from perfect linearity between two Armstrong modulators in a balanced configuration with quadrature carriers added and the present phase modulator having a carrier added which differs in phase from quadrature by a specific equal and opposite amount.

The value of E for which the maximum difference between equations (10) and (12) is minimum can be easily determined by direct computation, a typical result being shown in FIG. 3.

As shown in FIG. 3, the deviation from perfect linearity does not exceed 1.05° over the range $-\pi/2 \leq \phi \leq \pi/2$ when E = 42.44°. The phase error for a balanced Armstrong modulator, for which E = 0, is also shown in FIG. 3. By optimizing with respect to E, the maximum phase error is shown to have been reduced by a factor of 8. It must be understood that for values of E other than 42.44° results may be obtained as shown by the dotted line in FIG. 3 over the 180° range. Therefore, if the range of interest only covers only a portion of the range indicated in FIG. 3, it may be desirable to use a value for E other than 42.44° to achieve linearity which can be less than one degree.

From equation (11) it can be seen that the modulator is maximally linear for an analog signal when the coefficient of the second term, equivalent to the third-order nonlinearity, is set to zero. This occurs for E = 30° and equation (11) can be written as $$\phi(m;30°) = \sqrt{3}(m - m^5/5 + m^7/7 - ...). \quad (13)$$

From equation (13) it may be seen that the modulator has no even-order distortion and no third-order distortion. The even-order distortion is eliminated by the balanced configuration and the third-order distortion term is eliminated by setting E = 30°, the first distortion term being of fifth order.

The present linear phase modulator is also suitable for use with large modulating signal bandwidths such as high-speed pulse sequences for phase shift keying (PSK)-pulse code modulation (PCM) systems. For use in multi-level PSK, the modulator output should be multiplied by a factor of two in, for instance, a harmonic generator (not shown). The resulting output phase deviation would then be $\pm\pi$ radians which is sufficient for any number of levels. The performance of the modulator described by equation (10) can be illustrated by replacing a perfectly linear modulator described by equation (12) with such modulator in, for instance, a 16-level PSK system.

In a baud interval the phase begins at zero, increases in magnitude to one of the 16 levels and returns to zero at the end of the baud. The peak phase deviations for the perfect modulator then are $$\phi_k = k\,11.25°, k = \pm 1, \pm 3, \pm 5, \pm ..., \pm 15. \quad (14)$$

The phase angle between adjacent signal states is 22.5° and the angle between any state and its reference phases is 11.25°. This can be seen in the signal space diagram for 16-level PSK shown in FIG. 4 where the eight reference phases (R1–8) are shown by dashed lines while the correct signal deviations indicated hereinabove are shown by solid radii and the first number associated therewith.

Figure 4:
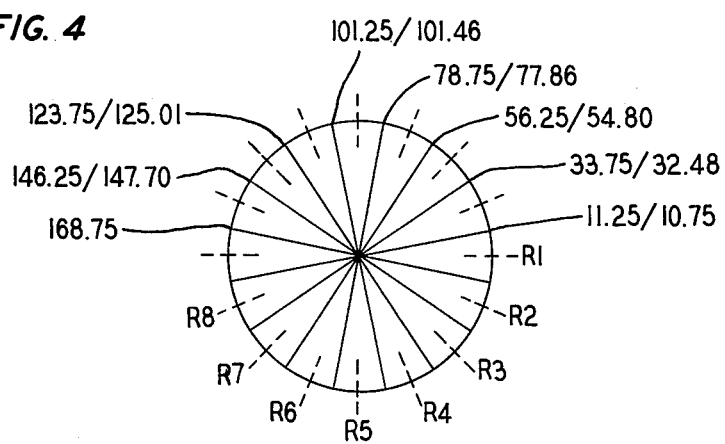
FIG. 4 is a signal space diagram for a typical 16-level phase shift keying system.

In substituting the imperfect modulator of equation (10) for the perfect one of equation (12), the maximum deviations ±168.75° are set correctly and $m_{15}$ is computed from equation (10). The other $m_k$ values are scaled in accordance with equation (14) and substituted into equation (10) to get the new phase deviations. The parameter E is next optimized by direct computation to minimize the maximum error in the new output phases. The maximum phase errors were found to occur for $k = \pm 5$ and $\pm 13$ and are ±1.45°. For this criterion, the increase in signal-to-noise ratio required to maintain the error rate achieved with the perfectly linear modulator is minimized. The optimum value of E = 40.75° and the new phase deviations are shown in FIG. 4 as the second numbers associated with each solid radii. The degradation in signal-to-noise ratio for these errors is approximately 0.5 dB as computed by the methods of the article "Error-Rate Considerations for Digital Phase-Modulation Systems", by V. K. Prabhu, *IEEE Transactions on Communication Technology*, Vol. COM-17, No. 1, February 1969, pp. 33–42. While this example illustrates the effect of phase errors on the error rate, it should be remembered that the degradation can be reduced to a negligible amount by adjusting the input pulse levels.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of generating a phase modulated signal having essentially no even-order and third-order nonlinearities, comprising the steps of:
   a. concurrently modulating an input signal with a first carrier signal in a first and a second suppressed-carrier modulator arranged in separate parallel paths for generating first and second output signals, respectively;
   b. adding to each of said first and second output signals a second and a third carrier signal, respectively, for generating respective third and fourth output signals, said second and third carrier signals comprising the same frequency as said first carrier signal while differing in phase from quadrature by preselected equal and opposite amounts; and
   c. combining said third and fourth output signals in a multiplier circuit for generating the phase modulated signal having essentially no even-order and third-order nonlinearities.

2. The method according to claim 1 comprising the additional step of
   d. after step (c) limiting the phase modulated signal to remove any amplitude variations.

3. A linear phase modulator capable of generating a phase modulated output signal having essentially no even-order and third-order nonlinearities comprising
   an input and an output terminal;
   a first and a second Armstrong modulator connected in a balanced configuration between the input and output terminals, each Armstrong modulator comprising an amplitude modulator capable of generating a double-sideband suppressed-carrier output signal in response to an applied input signal and a carrier signal, a phase shifting means capable of generating from said carrier signal an output signal which differs in phase from quadrature by a preselected equal and opposite amount from the output signal generated by the phase shifting means of the other Armstrong modulator, and an adder means capable of adding the output signal from the associated amplitude modulator and the output signal from the associated phase shifting means for generating an output signal in response thereto; and
   multiplier means capable of combining the output signals from the adder means of said first and second Armstrong modulators to generate said phase modulated output signal for transmission to said output terminal.

4. A linear phase modulator in accordance with claim 3 wherein the phase modulator further comprises a limiter connected between said combining means and said output terminal for substantially eliminating amplitude variations from the phase modulated output signal.

5. A linear phase modulator capable of generating a phase modulated output signal having essentially no even-order and third-order nonlinearities, comprising:
   an input and an output signal terminal;

a first and a second amplitude modulator connected in separate parallel paths between said input and output terminals capable of generating a first and a second double-sideband suppressed-carrier output signal, respectively, in response to the concurrent application of both an input and a carrier signal to said first and second modulators;

phase shifting means for generating from said carrier signal a first and a second output signal which differ in phase from quadrature by preselected equal and opposite amounts;

a first adder means capable of adding the first output signal from said phase shifting means to the output signal from said first modulator and generating a first adder means output signal in response thereto;

a second adder means capable of adding the second output from said phase shifting means to the output signal from said second modulator and generating a second adder means output signal in response thereto; and multiplier means capable of combining the first and second adder means output signals for transmission to said output terminal.

6. A linear phase modulator in accordance with claim 5 wherein the phase modulator further comprises a limiter connected between said combining means and said output terminal for substantially eliminating amplitude variations from the phase modulated output signal.

* * * * *